(12) United States Patent
Casati et al.

(10) Patent No.: US 8,751,980 B2
(45) Date of Patent: Jun. 10, 2014

(54) AUTOMATIC WAFER DATA SAMPLE PLANNING AND REVIEW

(71) Applicant: International Business Machines Corporation, Armonk, NY (US)

(72) Inventors: Nathalie Casati, Adliswil (CH); David DeMaris, Austin, TX (US); Maria Gabrani, Thalwil (CH); Ronald P. Luijten, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/663,816

(22) Filed: Oct. 30, 2012

(65) Prior Publication Data

US 2014/0123083 A1    May 1, 2014

(51) Int. Cl.
*G06F 17/50* (2006.01)
(52) U.S. Cl.
USPC .............................................. 716/55; 716/54
(58) Field of Classification Search
USPC .................................................... 716/50–55
See application file for complete search history.

(56) References Cited

U.S. PATENT DOCUMENTS

| | | | |
|---|---|---|---|
| 5,723,233 A | 3/1998 | Garza et al. | |
| 6,532,585 B1 | 3/2003 | Petranovic et al. | |
| 7,024,655 B2 | 4/2006 | Cobb | |
| 7,043,712 B2 | 5/2006 | Mukherjee et al. | |
| 7,366,343 B2 | 4/2008 | Takeuchi | |
| 7,653,892 B1 * | 1/2010 | Gennari et al. | 716/50 |
| 7,693,324 B2 | 4/2010 | Brasen et al. | |
| 2010/0122225 A1 | 5/2010 | Cao et al. | |
| 2012/0117521 A1 | 5/2012 | Feng et al. | |

OTHER PUBLICATIONS

A. Abdo, et al., "The Feasibility of Using Image Parameters for Test Pattern Selection During OPC Model Calibration," Proceedings of the (2010) SPIE Symposium on Optical Microlithography XXIII; pp. 7640-7648.

J. Chen, et al., "A Voronoi Interior Adjacency-Based Approach for Generating a Contour Tree," Elsevier Journal of Computers and Geosciences, vol. 30 (2004); pp. 355-367.

D. DeMaris, et al., "Fast Source Independent Estimation of Lithographic Difficulty Supporting Large Scale Source Optimization," Proceedings of SPIE vol. 8326 (2012); pp. 832614-1-832614-8.

P. Filitchkin, et al., "Contour Quality Assessment for OPC Model Calibration," Proceedings of SPIE, vol. 7272 (2009); pp. 72722-72727.

Y. Granik, et al., "Challenges of OPC Model Calibration from SEM Contours," Proc. of SPIE vol. 6922, 69221H, (2008); pp. 69221H-1-69221H-8.

(Continued)

*Primary Examiner* — Vuthe Siek
(74) *Attorney, Agent, or Firm* — Cantor Colburn LLP; Daniel Morris

(57) ABSTRACT

A method of constructing a mask for use in semiconductor device manufacturing is disclosed. A first shape that is related to mask construction is selected from a set of shapes. A second shape related to the mask construction is selected from the set of shapes. The first shape and the second shape are represented using a first shape vector and a second shape vector, respectively. A cluster is formed that includes the first shape and the second shape when the first shape vector and the second shape vector are within a selected criterion.

18 Claims, 8 Drawing Sheets

(56) References Cited

OTHER PUBLICATIONS

F. Huang, et al., "Multiple Face Contour Detection Based on Geometric Active Contours," Proceedings of Sixth IEEE Conference on Automatic Face and Gesture Recognition (2004); pp. 385-390.

J.-E. Jung, et al., "SEM Contour-Based Model OPC Calibrated with Optically Sensitive Patterns," Proceedings of SPIE Vo;. 6925 (2010); pp. 692516-1-692516-10.

K. Lai, et al., "Design Specific Joint Optimization of Masks and Sources on a Very Large Scale," Proceeding of SPIE vol. 7973 (2011); pp. 1-11.

J. Oberschmidt, et al., "Automation of Sample Plan Creation for Process Model Calibration," Proceedings of SPIE vol. 7640 (2010); pp. 76401G-1-76401G-9.

T. Shibahara, et al., "A CD-Gap-Free Contour Extraction Technique for OPC Model Calibration," Proceeding of SPIE vol. 7971 (2011); pp. 79710O-1-79710O-8.

C. Shishido, et al., "CD Bias Reduction in CD-SEM of Very Small Line Patterns: Sidewall Shape Measurement Using Model-Based Library Matching Method," Proceeding of SPIE vol. 7638 (2010); pp. 76383I-1-76383I-13.

K. Taravade, et al., "Two Dimensional Image-Based Model Calibration for OPC Applications," Proceedings of SPIE vol. 5377; (2004); pp. 1522-1527.

J. Villarrubia, et al., "Dimensional Metrology of Resist Lines Using a SEM Model-Based Library Approach," Proceedings of SPIE vol. 5375 (2004); pp. 199-209.

J. Villarrubia, et al., "Proximity-Associated Errors in Contour Metrology," Proceeding of SPIE 7638 (2010); pp. 1-11.

M. Ito, "An Automated System for LSI Fine Pattern Inspection Based on Comparison of SEM Images and CAD Data," Source: Robotics and Automation, 1995; Proceedings 1995 IEEE International Conference on Issue Date: May 21-27, 1995; On pp. 544-549; vol. 1; Location: Nagoya, Japan.

\* cited by examiner

AUTOMATIC WAFER DATA SAMPLE PLANNING AND REVIEW

BACKGROUND

The present disclosure relates generally to semiconductor manufacturing and, in particular, to a method of selecting mask patterns used in semiconductor device manufacturing resolution enhancement techniques; in particular for optical proximity correction (OPC) and resist model calibration.

When developing a process to manufacture chips at a new technology node or resolution scale, a number of preprocessing steps are developed to guarantee yield of the scaled down device features. One of these steps is the optical proximity correction (OPC) tool which is part of resolution enhancement techniques (RET) used to shape the mask for better yield. To calibrate and verify OPC's optical and resist models, one or more patterns are selected that produce features of the integrated chip within selected specifications. For each new OPC version, design of the mask begins from scratch. Typically, the patterns are pulled from a library of patterns and a modeler enters into a process of selecting those patterns that are to be used in the mask. The set of patterns pulled from the library and used in the mask are called sample plan (SP). The final set of patterns used in the OPC models calibration and verification are further selected based on their respective wafer image quality criteria. Several sub-processes of this process are currently performed manually, and are therefore slow to complete. Typical time frames for completing the entire selection process may take weeks.

SUMMARY

According to one embodiment, a method of constructing a mask for use in semiconductor device manufacturing includes: selecting, using a processor, a first shape related to mask construction from a set of shapes; selecting a second shape related to the mask construction from the set of shapes; representing the first shape and the second shape using a first shape vector and a second shape vector; and forming a cluster that includes the first shape with the second shape when the first shape vector and the second shape vector are within a selected criterion.

According to another embodiment, a computer program product includes a computer readable storage medium having computer readable program code embodied therewith, the computer readable program code comprising instructions, that when executed by a computer, implement a method of constructing a mask for use in semiconductor device manufacturing, wherein the method includes: selecting a first shape related to mask construction from a set of shapes; selecting a second shape related to the mask construction from the set of shapes; representing the first shape and the second shape using a first shape vector and a second shape vector; and forming a cluster that includes the first shape with the second shape when the first shape vector and the second shape vector are within a selected criterion.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The foregoing and other features, and advantages of the disclosure are apparent from the following detailed description taken in conjunction with the accompanying drawings in which:

DETAILED DESCRIPTION

Figure 1:
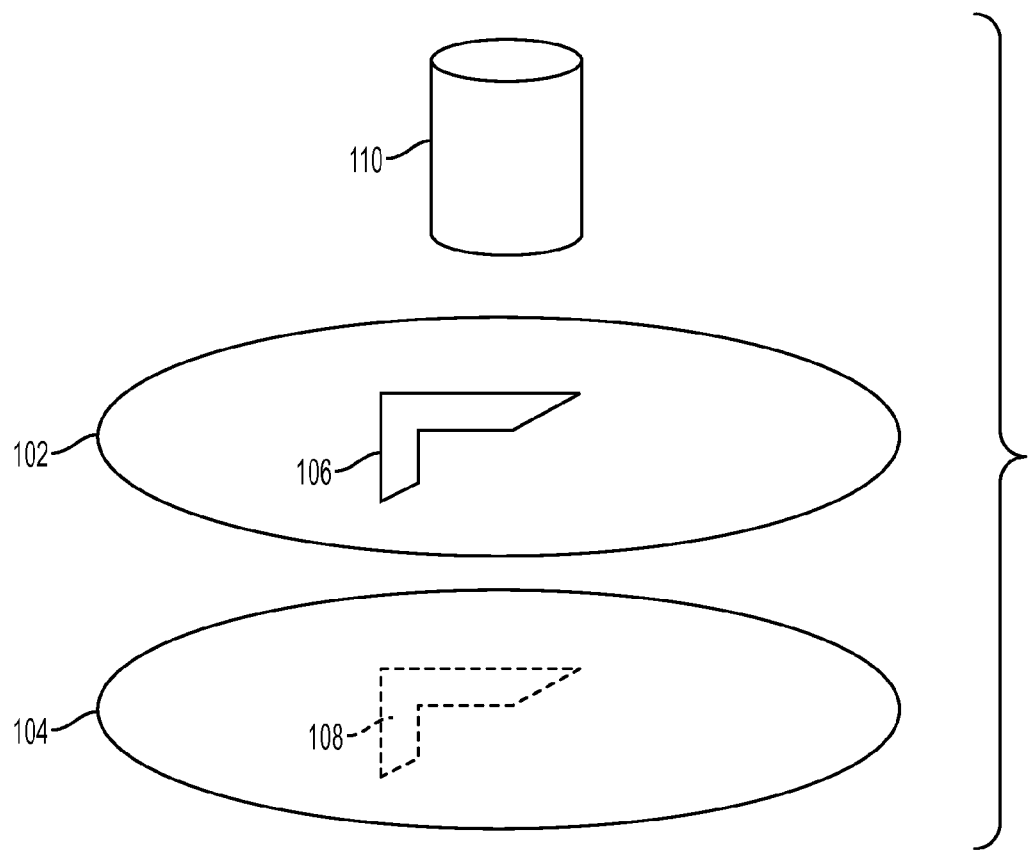
FIG. 1 shows an exemplary photolithography system for printing a pattern (forming a contour) on a wafer.

FIG. 1 shows an exemplary photolithography system 100 for forming a contour on a wafer. A mask 102 is held at a selected position with respect to the wafer or wafer substrate 104. The mask may have a pattern 106 formed therein. When exposed to a light source 110, such as an ultraviolet light source, a shape or contour 108 is formed at a light-sensitive photoresist on the wafer substrate 104 having a shape similar to the pattern 106. The shape 108 formed in the wafer substrate 104 may be a three-dimensional shape in various embodiments. Chemical treatment of the wafer substrate then engraves the shape 108 onto the wafer substrate 104. The exemplary shape 108 may be part of an integrated circuit design printed on a wafer substrate 104. A printed integrated circuit design generally includes a plurality of shapes that are combined to construct the integrated circuit. The mask 102 may include a plurality of patterns to print the plurality of shapes of the integrated circuit. In exemplary integrated circuit design, it is desired that a shape 108 formed in the wafer has clean edges and sharp corners. However, due to various physical realities such as diffraction effects, pattern location within the mask, etc., exemplary shape 108 may have rough edges and/or rounded corners, may have a two-dimensional shape, or other malformations, having a 2D contour shape. A pattern 106 is therefore selected for its suitability in forming a contour 108 that is reasonably close to a desired pattern 106.

Figure 2:
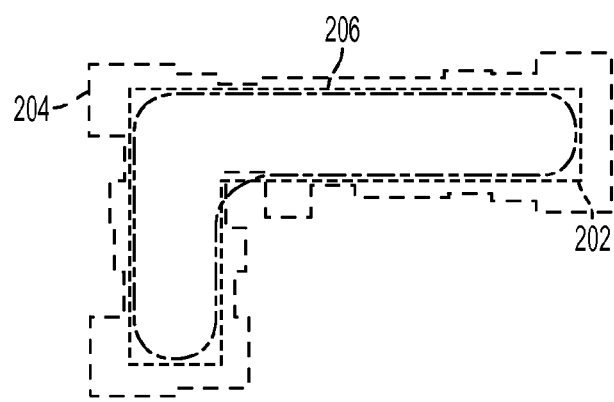
FIG. 2 illustrates various shapes descriptive of difficulties in integrated chip contour formation.

FIG. 2 illustrates various shapes descriptive of difficulties in integrated chip contour formation. Shape 202 shows a shape that a designer may desire to have formed at the wafer substrate 104. The exemplary desired shape 202 includes straight lines and sharp corners. In efforts to produce desired shape 202 at the wafer substrate 104, the mask 102 may include a pattern 106 having an exemplary mask shape 204 as shown in FIG. 2. The mask shape 204 differs from desired shape 202 by the inclusion various additional features, such as polygons, that compensate for distortions that occur during the process of contour formation in the wafer, as illustrated in FIG. 1. Exemplary printed shape 206 is a shape of a contour that may be formed at the wafer using exemplary mask shape 204 in the mask 102. Mask shape 204 is generally selected to produce the contour shape 206 to closely approximate the desired shape 202. For a given desired shape 202 of the integrated circuit, a number of possible mask shapes 204 may be used to produce a contour shape 206 that is reasonably close to the desired shape 202. These mask shapes or patterns depend on the quality of an optical proximity correction (OPC) and resist model, which in turn depends on the types of patterns used for generating the OPC and resist model. A total selection of patterns that may be candidates for use in OPC and resist models generation may be stored in a database and selected from the database for integrated circuit production based on various design rules dictated by a particular integrated circuit. Exemplary patterns may produce a variety of different contours or produce contours that are similar in shape but have different sizes, lengths, widths, heights, etc. Therefore, the number of patterns stored in the database may easily number in the hundreds of thousands.

Figure 3:
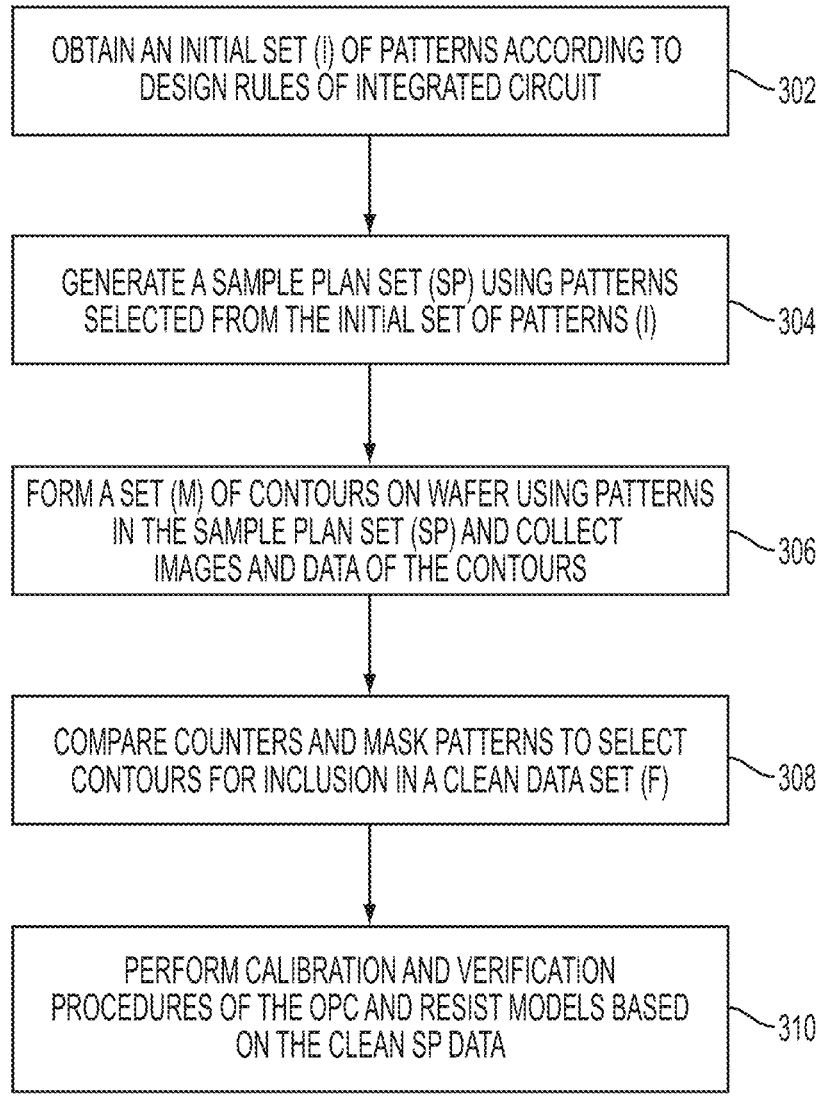
FIG. 3 shows a flowchart illustrating an exemplary method of selecting a set of patterns for use in optical proximity correction and resist model calibration and verification.

FIG. 3 shows a flowchart illustrating an exemplary method of selecting a set of patterns for use in OPC and resist model calibration and verification. The exemplary method may begin in box 202 when a modeler assembles an initial library I of patterns that may be suitable for an exemplary integrated circuit design. The initial library I is generally assembled based on various design rules. Exemplary design rules may include a width rule specifying a minimum width a pattern (reflecting an expected minimum width of a contour on the wafer), a spacing rule that specifies a minimum distance between two adjacent pattern shapes (reflecting an expected minimum distance between two adjacent contours), etc., and are generally based on the specifications of the integrated circuit. In box 304, a sample plan set SP is selected from the initial library (I) of patterns. Patterns are generally selected to be in the sample plan set SP based on their ability to produce the desired features on the wafer. In other words, the various shapes of the wafer features, i.e., straight lines, curves, corners, etc. dictate selection of the sample plan set SP. Details of box 304 are discussed further with respect to FIG. 5. In box 306, once the sample plan set SP is selected, for each pattern in the sample plan, a plurality of contours M is formed at a test wafer. An image, such as a scanning electron microscope (SEM) image or other suitable data, of the plurality of contours is formed. In box 308, the contours may be compared with each other and to the pattern vector (i.e., mask patterns) to reduce the sample plan set to obtain a final "clean" data set F. Details of box 308 are discussed further with respect to FIG. 6. In box 310, the clean data set F may then be used to calibrate and verify the OPC and resist models based on the clean SP data.

In various manufacturing processes, the act of obtaining a sample plan set SP from an initial pattern library I (box 304) is often done manually and is therefore generally a long process, often taking several weeks to complete. Attempts using Image Parameters (IP) to partially automate the selected process are hindered by the fact that IPs do not describe uniquely the patterns. Similarly, obtaining a clean data set F from the sample plan set SP (box 308) is a manual process that also often takes several weeks. The present disclosure therefore provides a method of reducing an amount of time to perform the actions of boxes 304 and 308.

Figure 4:
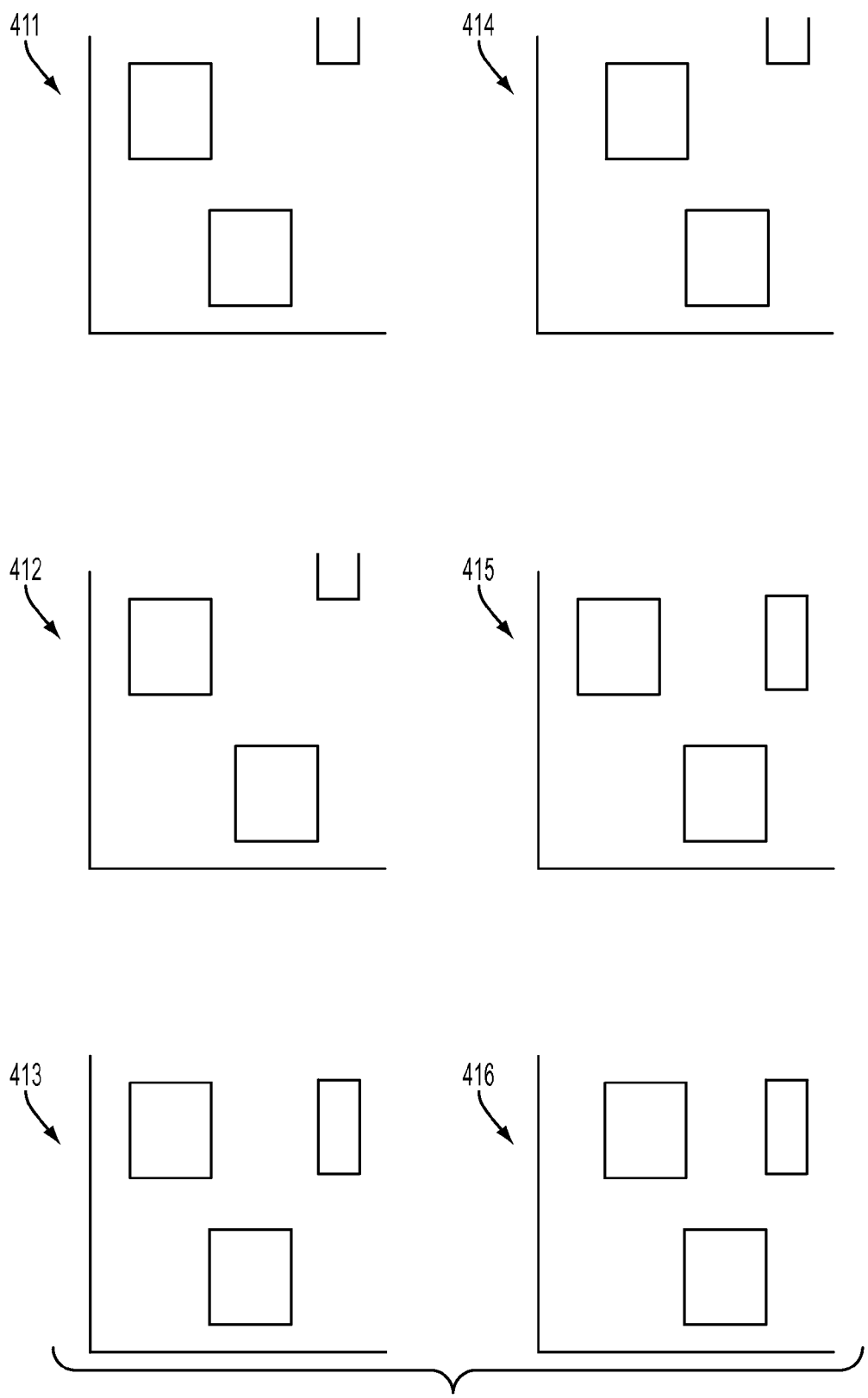
FIG. 4 shows exemplary set of shapes that may be grouped into a cluster according to a selected criterion.

FIG. 4 shows exemplary set of shapes, such as mask patterns 411-416, that may be grouped into a cluster according to a selected criterion. Exemplary mask patterns generally include a same number of polygons, etc. Locations of the polygons within the mask vary with respect to each other from one mask pattern to the next. Each mask pattern 411-416 may be quantified by an exemplary vector as shown below in Table 1. Each column of Table 1 includes coefficient values that are representative of the pattern named at the top of the column.

TABLE 1

| Pattern 411 | Pattern 412 | Pattern 413 | Pattern 414 | Pattern 415 | Pattern 416 |
| --- | --- | --- | --- | --- | --- |
| 2.1182 | 1.7223 | 2.1211 | 0.9890 | 1.7648 | 1.1049 |
| −i0.7130 | −i1.5202 | −i0.5262 | −i1.9663 | −i1.2527 | −i1.6541 |
| 0.2688− | −0.4201 | −0.0163 | 0.4624 | −0.6363 | 0.1580 |
| i0.3195 | −i0.8640 | −i0.4218 | −i0.8152 | −i0.9118 | −i0.8679 |
| 0.1004 | 0.3917 | −0.1105 | 0.3109 | 0.1517 | 0.0790 |
| +i0.3405 | +i0.1395 | −i0.0126 | −i0.1290 | −i0.1935 | −i0.4352 |
| 0.1024 | 0.0443 | 0.0986 | −0.0369 | 0.0463 | −0.0268 |
| +i0.5162 | +i0.5482 | −i0.3435 | +i0.1306 | −i0.3148 | +i0.6906 |
| 0.2614 | −0.0336 | 0.1186 | 0.0592 | −0.1469 | −0.0634 |
| +i0.0228 | +i0.1830 | −i0.0314 | +i0.1626 | +i0.1128 | +i0.0944 |
| 0.1575 | 0.1447 | −0.1734 | 0.2343 | −0.1849 | −0.1042 |
| −i0.0898 | −i0.0468 | −i0.0527 | +i0.0816 | −i0.0140 | +i0.1017 |
| 0.0583 | 0.0620 | −0.1597 | 0.1424 | −0.1564 | −0.0840 |
| +i0.0616 | +i0.1592 | −i0.1542 | +i0.1527 | −i0.0663 | −i0.0722 |
| 0.1499 | −0.0316 | 0.2190 | −0.3006 | 0.0557 | −0.1864 |
| −i0.1047 | +i0.0745 | −i0.0472 | −i0.0344 | +i0.1141 | +i0.0162 |
| −0.0559 | −0.1233 | −0.0513 | −0.0048 | −0.1119 | −0.0052 |
| +i0.0204 | −i0.0834 | −i0.0253 | −i0.0578 | −i0.1187 | −i0.0957 |

The exemplary vectors of Table 1 may be Fourier coefficients of the patterns or, alternately, may be coefficients obtained through another pattern transformation process or pattern quantification process.

To asses the similarity between exemplary patterns 411-416, several similarity criteria may be used. In an exemplary embodiment, an $L^2$ distance between two pattern vectors may be determined. $L^2$ distances for the exemplary mask patterns of FIG. 4 and Table 1 are shown below in Table 2.

TABLE 2

| Patterns | 412 | 413 | 414 | 415 | 416 |
| --- | --- | --- | --- | --- | --- |
| 411 | 0.2834 | 0.2254 | 0.4985 | 0.3612 | 0.5760 |
| 412 |  | 0.3678 | 0.2834 | 0.2254 | 0.3479 |
| 413 |  |  | 0.5992 | 0.2551 | 0.4486 |
| 414 |  |  |  | 0.3830 | 0.2295 |
| 415 |  |  |  |  | 0.2551 |

When the $L^2$-distance is smaller than a selected threshold (for example, a threshold value of Thr=0.9005), then the patterns, even though they are not exactly the same, may be grouped in a same cluster. Thus, the exemplary patterns 411-416 may be grouped in a same cluster.

Various vectors may be compared to achieve selected outcomes. In one embodiment, the first shape may be a first contour formed in a wafer from a selected pattern and the second shape may be a second contour formed in the wafer from the selected pattern. In this embodiment, a first vector may be extracted from the first contour and a second vector may be extracted from the second contour to perform at least one of: determining a sensitivity of printing the pattern to at least a process parameter; and selecting at least one of the first contour and the second contour for inclusion in a first data set according to an inclusion criterion.

In another embodiment, the first shape may be a first contour formed in a wafer from a first pattern and the second shape may be a second contour formed in the wafer from a second pattern. In this embodiment, a first vector extracted from the first contour and a second vector extracted from a second contour may be compared to form a cluster of contours when the first contour vector and the second contour vector are within a selected criterion.

In another embodiment, the first shape may be a pattern and the second shape may be a contour formed in the wafer from the selected pattern. A pattern vector extracted from the pattern may be compared to a contour vector extracted from the contour to perform at least one of: examining an image quality of the contour; and examining a measurement quality of a contour. Furthermore, comparing the pattern vector to its corresponding contour vector may enable the modeler to determining a sensitivity of printing the pattern to at least a process parameter and/or determining a location of a maximum distance between the pattern in the mask and the contour as the location for the measurement. Contours that fail to form a feature having a same topological structure as its corresponding pattern may be removed and stored for use in model verification.

Figure 5:
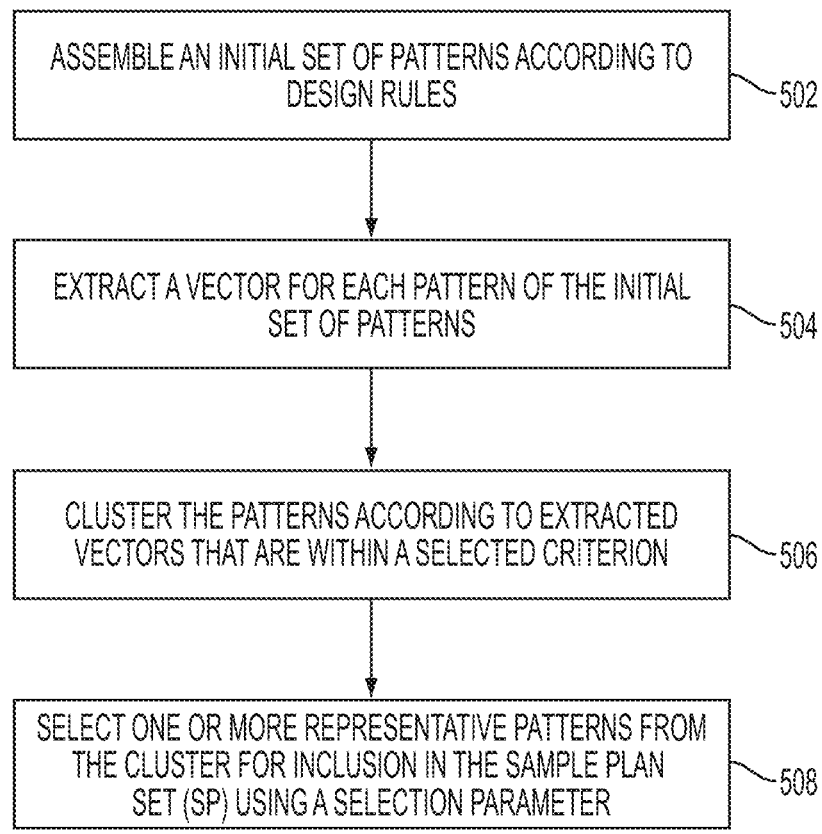
FIG. 5 shows an exemplary method of the present disclosure for selecting a pattern from an initial pattern library I for inclusion in a sample plan set SP.

FIG. 5 shows an exemplary method of the present disclosure for selecting a pattern from an initial pattern library I for inclusion in a sample plan set SP. In box 502, an initial pattern library I is assembled according to design rules. The patterns of library I may be critical patterns, as determined generally from previous tests and/or wafer design experience. The patterns of library I may be patterns that are important to wafer design or patterns that are generally problematic in wafer design imaging. In various embodiments, the patterns of set I produce the entire set of contours that are to be formed in the selected integrated circuit. In box 504, a vector, or pattern vector, is extracted from each pattern of the initial set of patterns. In one embodiment, a vector extracted from a pattern may include, for example, a set of coefficients of a Fourier transform of the pattern or other suitable coefficients. In box 506, patterns of the initial set are clustered together based on their extracted vectors. For example, patterns are clustered when their extracted vectors are within a selected criterion of each other. A cluster of patterns may therefore include patterns capable of substantially forming the same contour at the wafer. Thus, clusters may be formed for line patterns, corner patterns, edge patterns, etc. The elements of the extracted vector may describe a shape of the pattern but may also include terms that represent diffraction effects for the pattern, for example.

In box 508, one or more representative patterns are selected from a pattern cluster. Various criteria may be used to select the one or more representative patterns from the pattern cluster. For example, a pattern may be selected due to its ability to print a "difficult" contour. Contour difficulty may be estimated using an algorithm performed on the pattern vector, and may also be measured via a parameter known as a litho-difficulty estimator (LDE). Also, a pattern may be selected for its sensitivity to various process parameters, and/or its image parameters. Sensitivity parameters may also be used. Pattern selection therefore may include selecting an LDE and/or a sensitivity and/or image parameter that meets selected criteria. In general, a selected pattern has an associated LDE and/or sensitivity and/or set of image parameters that may be stored in a database and that may therefore be compared to selected criteria using a processor. From any given cluster, one may select more than one representative element. The SP set may therefore include a subset of representative elements. Pattern selection is complete when all of the contours of the integrated circuit are printable using the selected patterns. The selected patterns of set SP thereby produce substantially all contours of the integrated circuit, including various configurations of lines, corners, end-of-lines, and other shapes of the integrated circuit.

Figure 6:
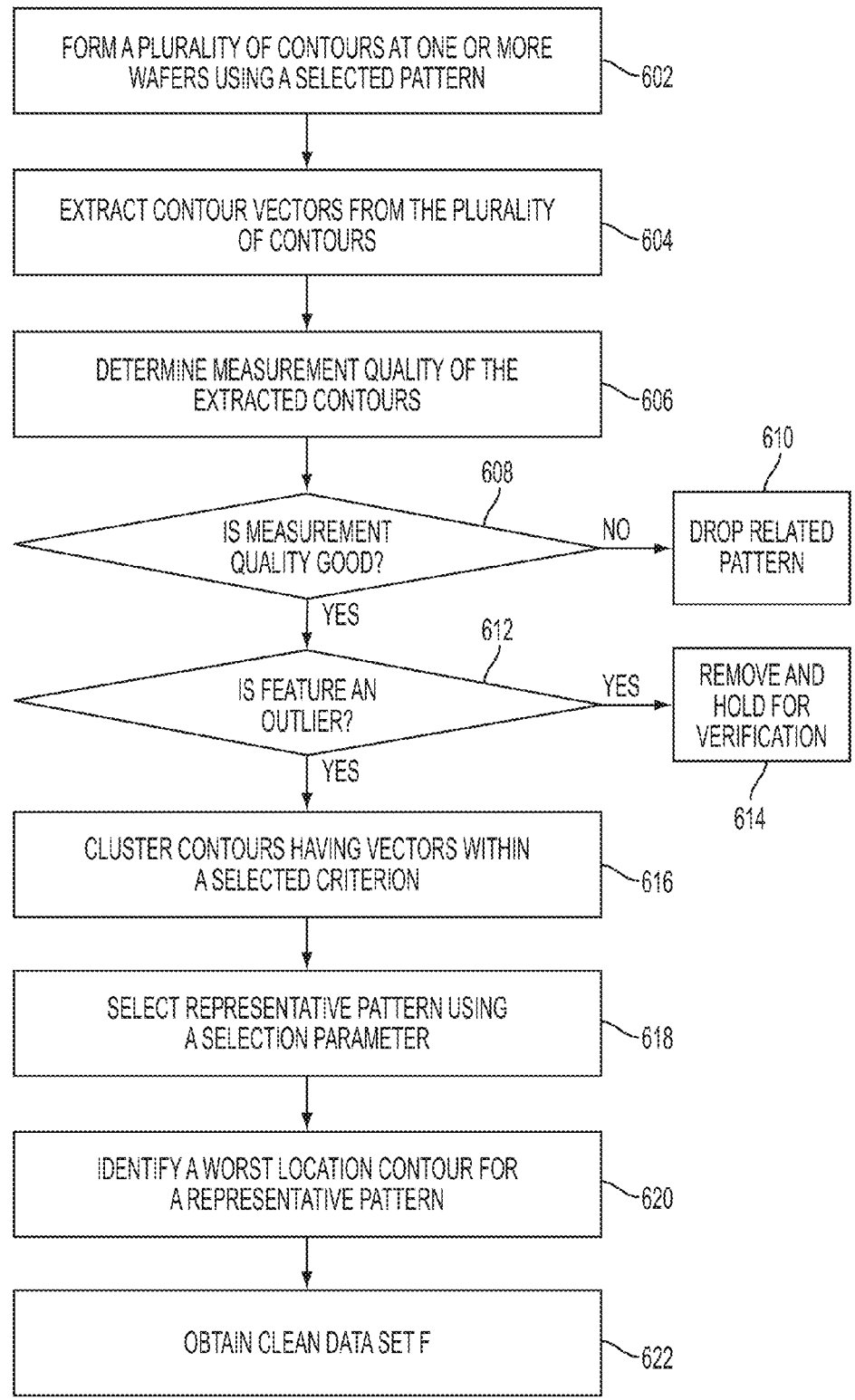
FIG. 6 shows a flowchart illustrating an exemplary method of selecting a pattern from sample plan set SP for inclusion in a final set F.

FIG. 6 shows a flowchart illustrating an exemplary method of selecting a pattern from sample plan set SP for inclusion in a final set (clean data set F). In box 602, the sample plan set SP of patterns is printed to generate a set M of contours on one or more wafers under different lithographic process conditions. Each pattern of the sample plan set is used to create a plurality of contours at several locations in the wafer. In box 604, contour vectors are determined for the plurality of contours. In box 606, a quality of the contour is evaluated. In an exemplary embodiment for determining image quality, the quality of the contour may be evaluated by its smoothness, or by measuring Line Edge Roughness (LER), by measuring the width of the contour (or the distance between adjacent contour) across several slices parallel to the measurement gauge. In another exemplary embodiment for determining measurement accuracy, a center of gravity of the pattern is determined and a center of gravity of the contour is determined. These centers of gravity may be compared to each other, and when the centers of gravity are within a selected criterion of the same location (e.g., the location of the gauge measurement), the quality of the measurement of the contour may be considered acceptable. In box 608, when the image quality of the measurement accuracy is not acceptable, then the image and its respective measurement are dropped from consideration (box 610). When the image quality and the measurement are considered acceptable, the method proceeds to box 612.

In box 612, outlier contours are identified. An outlier may include a contour that fails to substantially reproduce the desired shape. For example, the desired shape may include two lines, while the outlier contour may include only one line (i.e., a closed contour). Alternately, the desired shape may include one line, while the outlier contour includes two lines (i.e., an open contour). The contours are compared to the mask patterns. Alternately, contour vectors may be compared to corresponding pattern vectors. If the contours vary significantly from the shapes of the mask patterns, then the contours are denoted as outliers. In box 612, if the contour is identified as an outlier, the corresponding pattern is removed from consideration so that it is not included in the final sample set F in box 614. The removed pattern is however retained for verification purposes. If the contour is not an outlier, the method proceeds to box 616.

In box 616, the remaining contours are clustered. This can be done by checking the similarity of the fitted contours or by comparing their contour vectors, using the method discussed with respect to Tables 1 and 2 above. In one embodiment, contours may be clustered by comparing topological elements of the contours. An exemplary topological element may include a pair of lines that converge to form a single line or, alternately, a single line that splits into a pair of lines. A count of the topological elements and a mapping of their relation to neighboring elements may be made. Also, the similarity of the contours may be measured using various metrics, such as a Hausdorf distance or a Frechet distance. As a result of counting topological elements and observing contour similarity, it is possible to identify similar contours and/or repetitive contours. Therefore, one may cluster several features into similarity classes, as well as to identify those features that do not fit into a similarity class. In an exemplary embodiment, contours may be clustered that an in a similarity class, through made from different patterns.

In box 618, a representative contour may be selected to represent a similarity class. The representative contour may represent a statistical mean of the contours in the similarity class, or be the contour of the representative element selected in box 508. In box 620, the representative contour may be compared to the pattern to identify locations where the pattern does not print effectively. In an exemplary embodiment, contour vector is compared to extracted pattern vector to identify poor printing locations. The comparison of the contour with the pattern and the identification of bad locations may provide a quality control of the selected pattern the clean data F. The comparison may thus be used to refine parameters used in selecting representative patterns from pattern clusters in future OPC models (as in box 508). In box 622, the selected pattern may then be included in clean data set F according to a selected criterion.

Figure 7:
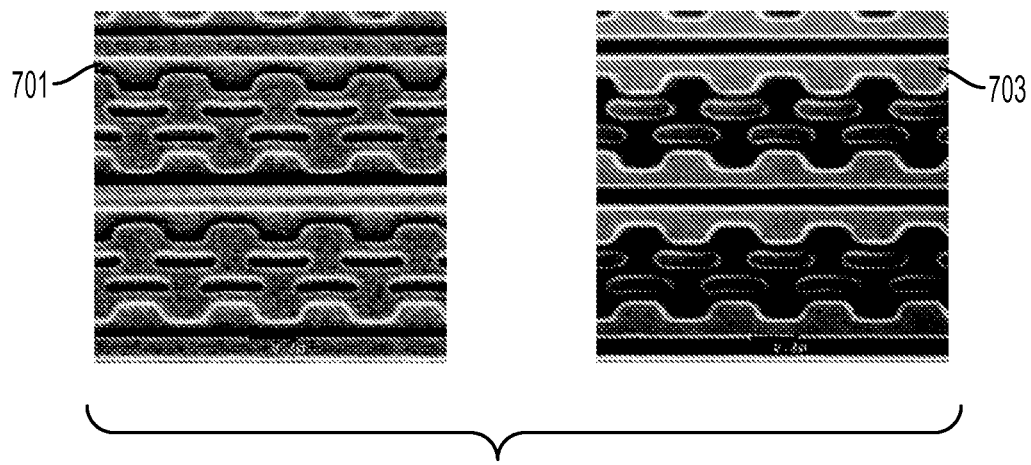
FIG. 7 shows an exemplary contour formed on a wafer substrate using a pattern.

FIG. 7 shows an exemplary contour formed on a wafer substrate using a pattern. A typical SEM image 701 of the contours is shown on the left hand side. An edge-enhanced image 703 of the contours is shown on the right hand side. The edge-enhanced image 703 may be derived using a curve fitting algorithm on image 701. In an exemplary embodiment, an initial set of control points are used to provide an initial outline of the contour, wherein the initial set of control points, i.e., points where the curve fitting algorithm initializes its weights and minimization criterion, are obtained from the pattern used to form the contour. In one embodiment, a curve fitting algorithm may derive the outline based on cubic splines.

Figure 8:
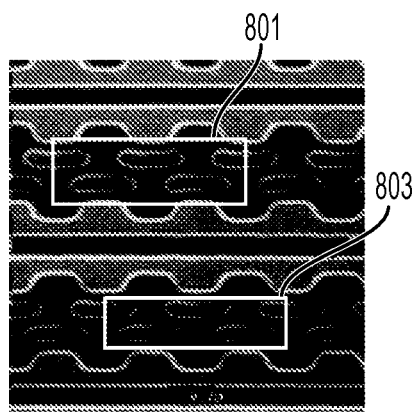
FIG. 8 shows two exemplary windows of the image of FIG. 7.
Figure 9:
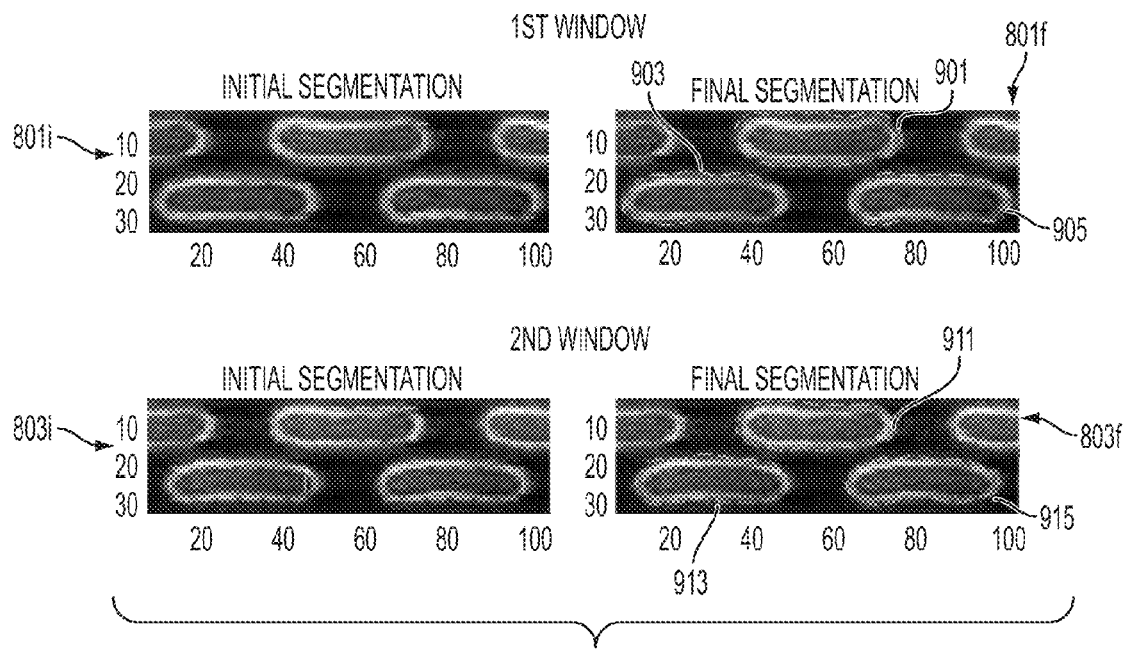
FIG. 9 shows outlines obtained using various segmentation procedures on the window of FIG. 8.

FIG. 8 shows two windows 801 and 803 of the image 703. The contours in the selected areas may be compared to each other to determine the similarity of the contours. FIG. 9 shows the outlines obtained using various segmentation procedures on the window of FIG. 8. In FIG. 9, the initial control points and the final outlines are shown for contours found in the windows of FIG. 8. Window 801 of FIG. 8 is reproduced as windows 801*i* and 801*f* in FIG. 9. Window 803 of FIG. 8 is reproduced as windows 803*i* and 803*f* of FIG. 9. Window 801*f* includes outlines 901, 903 and 905 of exemplary contours displayed in window 801*f*. Similarly, window 803*f* includes outlines 911, 913 and 915 of exemplary contours displayed in window 803E Outlines 901 and 911 may be compared to each other to determine a consistency of contour formation at different locations on the substrate using a selected pattern. Similar comparisons may be made between outlines 903 and 913 are and between outlines 905 and 815.

Figure 10:
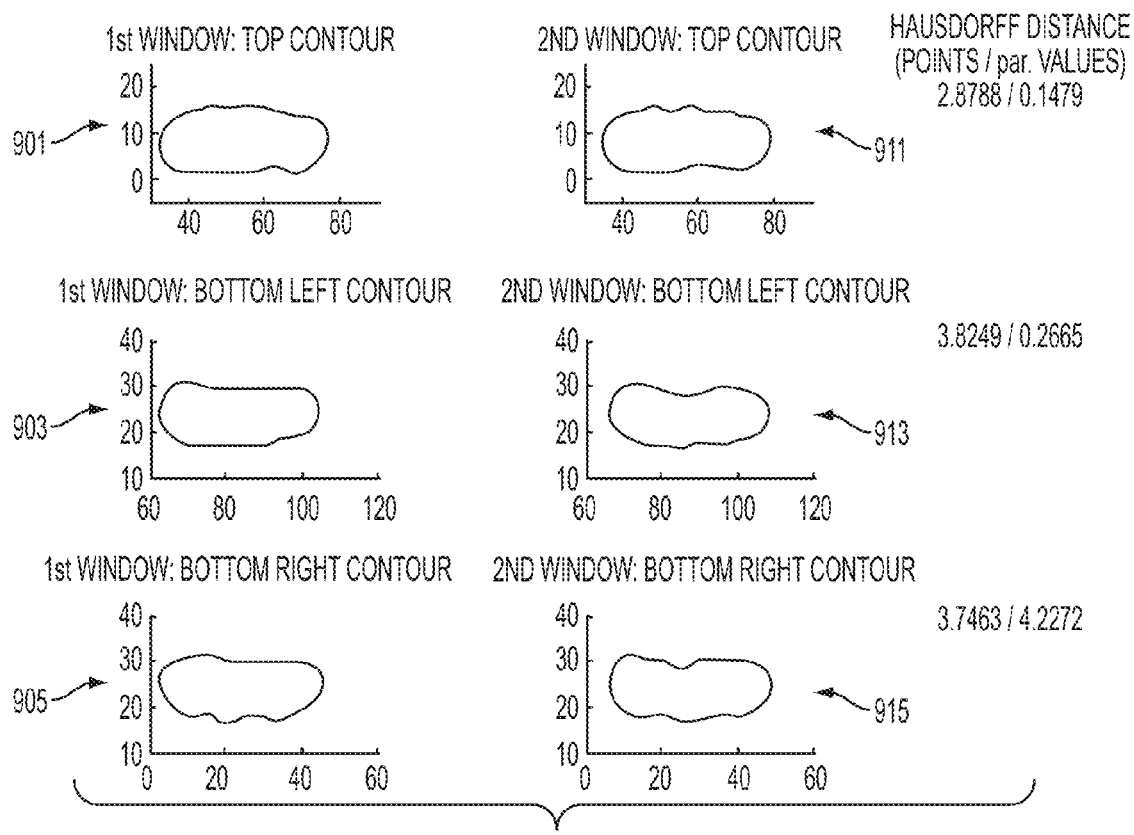
FIG. 10 shows the various outlines obtained from the contours shown in FIG. 9.

FIG. 10 shows the various outlines obtained from the contours shown in FIG. 9. Outlines 901, 903 and 905 of FIG. 9 are reproduced in the left-hand column of FIG. 10. Outlines 911, 913 and 915 of FIG. 9 are reproduced in the right-hand column of FIG. 10. Hausdorff distances between the contours and the parametric values (the values of the cubic splines at the final set of points) are also displayed. Outline 901 is compared to outline 911 to obtain a Hausdorff distance. Also, a parametric value such as a value of a cubic spline at the final points of the estimated contour may be obtained. Similarly, outline 903 is compared to outline 913 to obtain a Hausdorff distance and outline 905 is compared to outline 915 to obtain a Hausdorff distance. The extracted outlines therefore are used to compare and analyze the contours of the SEM image.

Figure 11:
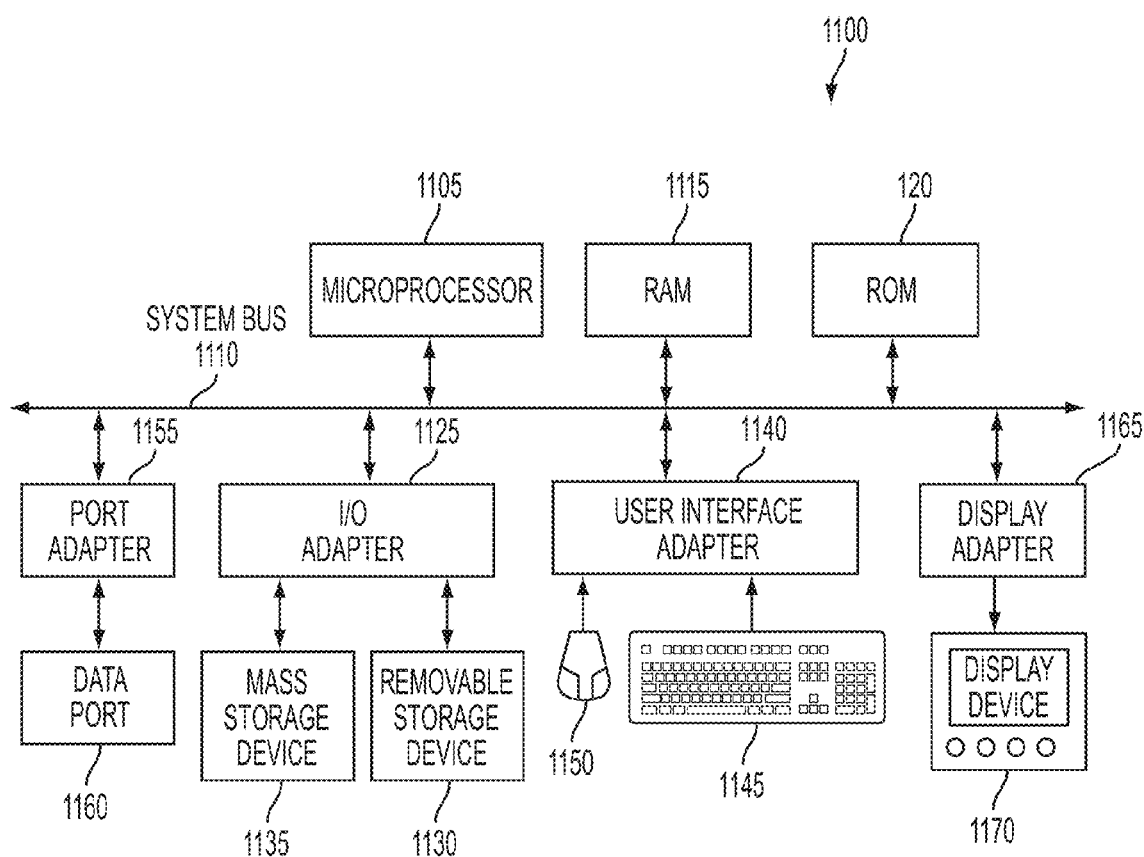
FIG. 11 is a schematic block diagram of a general-purpose computing system suitable for practicing embodiments of the present invention.

Generally, the method embodiments for implementing systematic, variation-aware integrated circuit extraction may be practiced with a general-purpose computer and the method may be coded as a set of instructions on removable or hard media for use by the general-purpose computer. FIG. 11 is a schematic block diagram of a general-purpose computing system suitable for practicing embodiments of the present invention. In FIG. 11, computing system 1100 has at least one microprocessor or central processing unit (CPU) 1105. CPU 1105 is interconnected via a system bus 1110 to a random access memory (RAM) 1115, a read-only memory (ROM) 1120, an input/output (I/O) adapter 1125 for a connecting a removable data and/or program storage device 1130 and a mass data and/or program storage device 1135, a user interface adapter 1140 for connecting a keyboard 1145 and a mouse 1150, a port adapter 1155 for connecting a data port 1160 and a display adapter 1165 for connecting a display device 1170.

ROM 1120 contains the basic operating system for computing system 1100. The operating system may alternatively reside in RAM 1115 or elsewhere as is known in the art. Examples of removable data and/or program storage device 1130 include magnetic media such as floppy drives and tape drives and optical media such as CD ROM drives. Examples of mass data and/or program storage device 1135 include hard disk drives and non-volatile memory such as flash memory. In addition to keyboard 1145 and mouse 1150, other user input devices such as trackballs, writing tablets, pressure pads, microphones, light pens and position-sensing screen displays may be connected to user interface 1140. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 1130, fed through data port 1160 or typed in using keyboard 1145.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above and illustrated in FIGS. 3-10.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flow diagrams depicted herein are just one example. There may be many variations to this diagram or the steps (or operations) described therein without departing from the spirit of the disclosure. For instance, the steps may be performed in a differing order or steps may be added, deleted or modified. All of these variations are considered a part of the claimed disclosure.

While the exemplary embodiment to the disclosure had been described, it will be understood that those skilled in the art, both now and in the future, may make various improvements and enhancements which fall within the scope of the claims which follow. These claims should be construed to maintain the proper protection for the disclosure first described.

What is claimed is:

1. A method of constructing a mask for use in semiconductor device manufacturing, the method comprising:
    selecting, using a processor, a first shape related to mask construction from a set of shapes;
    selecting a second shape related to the mask construction from the set of shapes;
    representing the first shape using a first shape vector that includes coefficients that are indicative of the first shape; and the second shape using a second shape vector that includes coefficients that are indicative of the second shape; and
    forming a cluster that groups the first shape with the second shape when a distance metric between the coefficients of the first shape vector and the coefficients of the second shape vector is less than a selected criterion.

2. The method of claim 1, wherein the first shape is a mask pattern and the second shape is a mask pattern.

3. The method of claim 2, further comprising selecting one or more representative patterns from the formed cluster using a selected criterion.

4. The method of claim 3, further comprising using an extracted contour vector to select the representative pattern.

5. The method of claim 3, wherein the selected criterion includes at least one of:
    a difficulty of printing the pattern; a sensitivity of the pattern to process parameters; and
    an ability of the patterns to cover an image parameters space.

6. The method of claim 1, wherein the first shape is a first contour formed in a wafer from a selected pattern and the second shape is a second contour formed in the wafer from the selected pattern.

7. The method of claim 6, further comprising comparing a first vector extracted from the first contour and a second vector extracted from the second contour to perform at least one of: determining a sensitivity of printing the pattern to at least a process parameter; and selecting at least one of the first contour and the second contour for inclusion in a first data set according to an inclusion criterion.

8. The method of claim 6, further comprising comparing a contour vector to a corresponding pattern vector to perform at least one of: determining a sensitivity of printing the pattern to at least a process parameter; and determining a location of a maximum distance between the pattern in the mask and the contour as the location for the measurement.

9. The method of claim 1, wherein the first shape is a first contour formed in a wafer from a first pattern and the second shape is a second contour formed in the wafer from a second pattern.

10. The method of claim 9, further comprising comparing a first vector extracted from the first contour and a second vector extracted from a second contour to form a cluster of contours when the first contour vector and the second contour vector are within a selected criterion.

11. The method of claim 9 further comprising removing a pattern that fails to form a feature having a same topological structure as the pattern for use in model verification.

12. The method of claim 1, wherein the first shape is a pattern and the second shape is a contour formed in the wafer from the selected pattern, further comprising comparing a pattern vector extracted from the pattern to a contour vector extracted from the contour to perform at least one of: examining an image quality of the contour; and examining a measurement quality of a contour.

13. A non-transitory computer readable storage medium having computer readable program code embodied therewith, the computer readable program code comprising instructions that, when executed by a processor, enable the processor to construct a mask for use in semiconductor device manufacturing, wherein the computer-readable program code includes instructions to:
    select a first shape related to mask construction from a set of shapes;
    select a second shape related to the mask construction from the set of shapes;
    represent the first shape using a first shape vector that includes coefficients that are indicative of the first shape and the second shape using a second shape vector that includes coefficients that are indicative of the second shape; and
    form a cluster that groups the first shape with the second shape when a distance metric between the coefficients of the first shape vector and the coefficients of the second shape vector is less than a selected criterion.

14. The non-transitory computer readable storage medium of claim 13, wherein the first shape and the second shape are at least one of: (i) a first mask pattern and a second mask pattern; (ii) a first contour formed in a wafer from a selected pattern and a second contour formed in the wafer from the selected pattern; and (iii) a first contour formed in a wafer from a first pattern and a second contour formed in the wafer from a second pattern.

15. The non-transitory computer readable storage medium of claim 14, wherein the first shape is a first contour formed from the selected pattern and the second shape is a second contour formed from the selected pattern, the method further comprising comparing a first vector extracted from the first contour and a second vector extracted from the second contour to perform at least one of:
    determining a sensitivity of printing the pattern to at least a process parameter; and
    selecting at least one of the first contour and the second contour for inclusion in a first data set according to an inclusion criterion.

16. The non-transitory computer readable storage medium of claim 15, further comprising using an extracted contour vector to select a representative contour from the cluster of contours.

17. The non-transitory computer readable storage medium of claim 13, further comprising selecting one or more representative patterns from the formed cluster using a selected criterion.

18. The non-transitory computer readable storage medium of claim 13, wherein the selected criterion includes at least one of: a difficulty of printing the pattern; a sensitivity of the pattern to process parameters; and an ability of the patterns to cover an image parameter space.

* * * * *